(12) United States Patent
Johnson

(10) Patent No.: US 12,424,541 B2
(45) Date of Patent: Sep. 23, 2025

(54) MULTI-LAYER INDUCTOR

(71) Applicant: TEXAS INSTRUMENTS INCORPORATED, Dallas, TX (US)

(72) Inventor: Brian David Johnson, Tucson, AZ (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 175 days.

(21) Appl. No.: 16/832,803

(22) Filed: Mar. 27, 2020

(65) Prior Publication Data

US 2020/0388570 A1 Dec. 10, 2020

Related U.S. Application Data

(60) Provisional application No. 62/857,840, filed on Jun. 6, 2019.

(51) Int. Cl.

| | |
|---|---|
| *H01L 23/522* | (2006.01) |
| *H01F 27/28* | (2006.01) |
| *H01F 27/29* | (2006.01) |
| *H01L 23/528* | (2006.01) |
| *H10D 1/20* | (2025.01) |
| *H10D 84/40* | (2025.01) |

(52) U.S. Cl.
CPC ..... *H01L 23/5227* (2013.01); *H01F 27/2804* (2013.01); *H01F 27/29* (2013.01); *H01L 23/5226* (2013.01); *H01L 23/528* (2013.01); *H10D 1/20* (2025.01); *H10D 84/40* (2025.01); *H01F 2027/2809* (2013.01)

(58) Field of Classification Search
CPC ....... H01L 2924/00; H01L 2924/00014; H01L 24/48; H01L 2224/48091; H01L 2924/014
See application file for complete search history.

(56) References Cited

U.S. PATENT DOCUMENTS

| | | | |
|---|---|---|---|
| 2011/0248811 A1* | 10/2011 | Kireev | H01L 23/5227 336/200 |
| 2015/0206934 A1* | 7/2015 | Funaya | H01L 24/06 438/3 |
| 2016/0121731 A1* | 5/2016 | Matsumoto | H02J 5/005 307/104 |
| 2020/0287520 A1* | 9/2020 | Kamgaing | H03H 9/0561 |

* cited by examiner

*Primary Examiner* — Tony Tran
(74) *Attorney, Agent, or Firm* — Mandy Barsilai Fernandez; Frank D. Cimino

(57) ABSTRACT

A device includes a first metal layer including a first terminal outside the first coil and a second terminal within the inner area of the first coil. A second metal layer has a second coil. The second coil has a first terminal outside the second coil and a second terminal within its inner area. A first via electrically couples the second terminals of the first and second coils. A third metal layer has a third coil defining an inner area which at least partially overlaps the inner areas of the first and second coil. The third coil has a first terminal outside the third coil and a second terminal within its inner area. The second coil at least partially overlaps the third coil. A second via electrically couples together the first terminal of the second coil and the second terminal of the third coil.

2 Claims, 7 Drawing Sheets

MULTI-LAYER INDUCTOR

CROSS-REFERENCE TO RELATED APPLICATIONS

This application claims priority to U.S. Provisional Application No. 62/857,840, filed Jun. 6, 2019, which is hereby incorporated by reference.

BACKGROUND

An inductor is a passive two-terminal electrical component that stores energy in a magnetic field when a time-varying electric current flows through the inductor. An inductor is characterized by its inductance, measured in units of henries (H), which is the ratio of the voltage to the rate of change of current. An inductor is generally formed by a conductive coil having one or more windings.

SUMMARY

In accordance with at least one example, a device includes a first metal layer including a first terminal outside the first coil and a second terminal within the inner area of the first coil. A second metal layer has a second coil. The second coil has a first terminal outside the second coil and a second terminal within its inner area. A first via electrically couples the second terminals of the first and second coils. A third metal layer has a third coil defining an inner area which at least partially overlaps the inner areas of the first and second coil. The third coil has a first terminal outside the third coil and a second terminal within its inner area. The second coil at least partially overlaps the third coil. A second via electrically couples together the first terminal of the second coil and the second terminal of the third coil.

BRIEF DESCRIPTION OF THE DRAWINGS

For a detailed description of various examples, reference will now be made to the accompanying drawings in which.

DETAILED DESCRIPTION

Implementing a two-terminal inductor can be challenging due to space constraints, particularly in, for example, a semiconductor die or a printed circuit board (PCB) application. Dies and PCBs typically have multiple, vertically-arranged metal layers formed of insulating materials. In such applications, an inductor can be formed as multiple coils with each coil formed on a different metal layer. The individual coils are connected together with vias to form an inductor. Using multiple metal layers for coils of the inductor increases the number of turns of the inductor's windings which helps to increase the inductance of the inductor. Further, forming each coil on a different metal layer also helps to increase the inductance due to mutual inductance between the coils on the separate metal layers.

Figure 1:
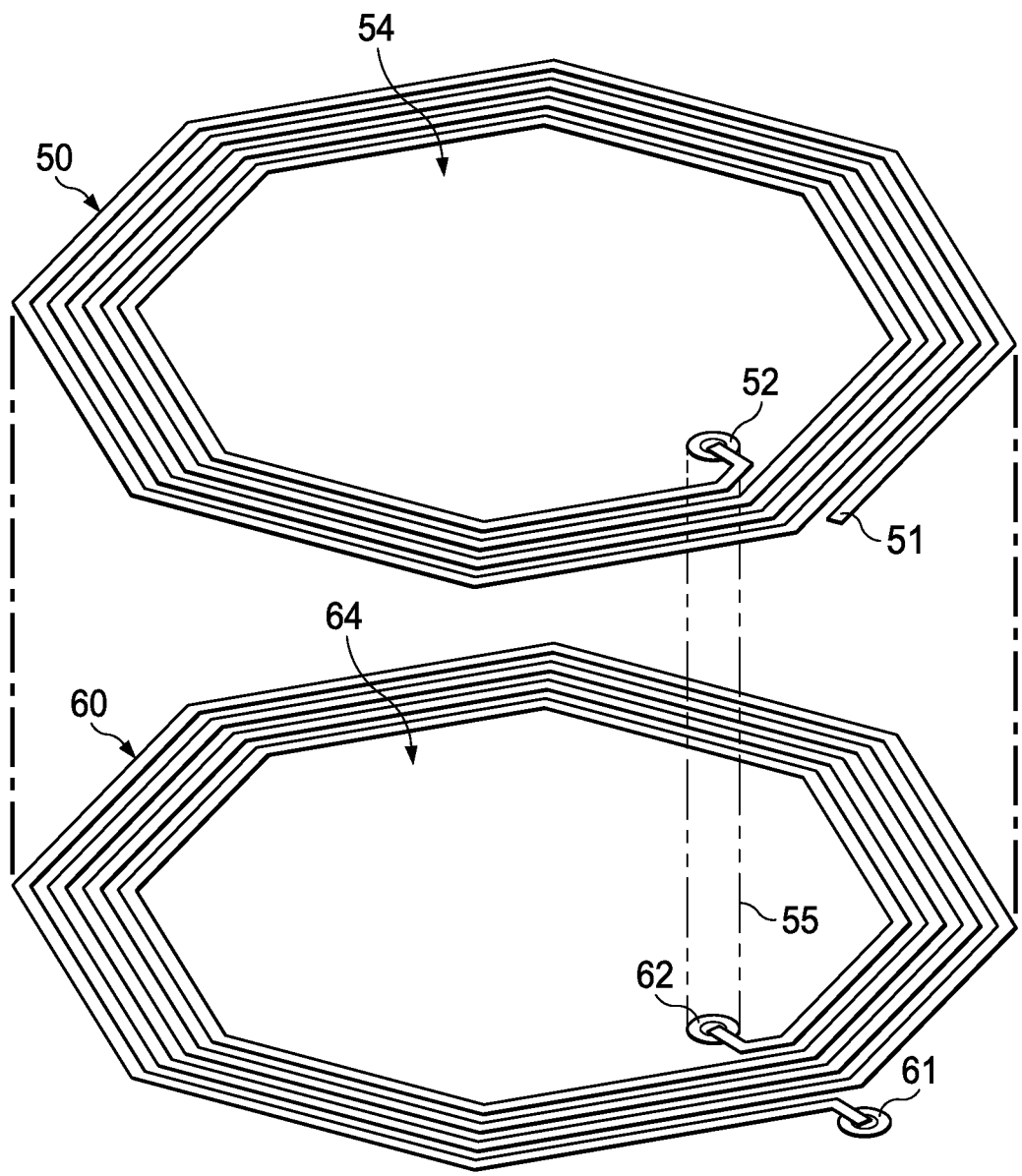
FIG. 1 illustrates a two-coil inductor.

FIG. 1 illustrates two conductive coils 50 and 60 forming a single inductor. This inductor, as is the case with the other inductors described herein, can be implemented over a semiconductor substrate, within a package used to encapsulate a semiconductor device a PCB, or in any other suitable form factor. Coil 50 is formed within one metal layer and coil 60 is formed in a different, vertically-spaced, metal layer. Coil 50 has terminals 51 and 52 and coil 60 has terminals 61 and 62. Starting at outer terminal 51, coil 50 wraps in a particular direction (either clockwise or counterclockwise) inward towards inner terminal 52 (inside the area 54 defined by coil 50). A via electrically connects inner terminals 52 (of coil 50) and 62 (of coil 60). Coil 60 wraps in the same direction as coil 50 (preferably) starting at inner terminal 62 towards outer terminal 61. Outer terminals 51 and 61 represent the end terminals of the inductor and are readily accessible to be connected to other components within the die, PCB, or other structure in which the inductor is fabricated. In other example implementations, the coils may wrap clockwise or counterclockwise and may wrap inwardly from an inner terminal to an outer terminal or outwardly from an outer terminal to an inner terminal.

Figure 2:
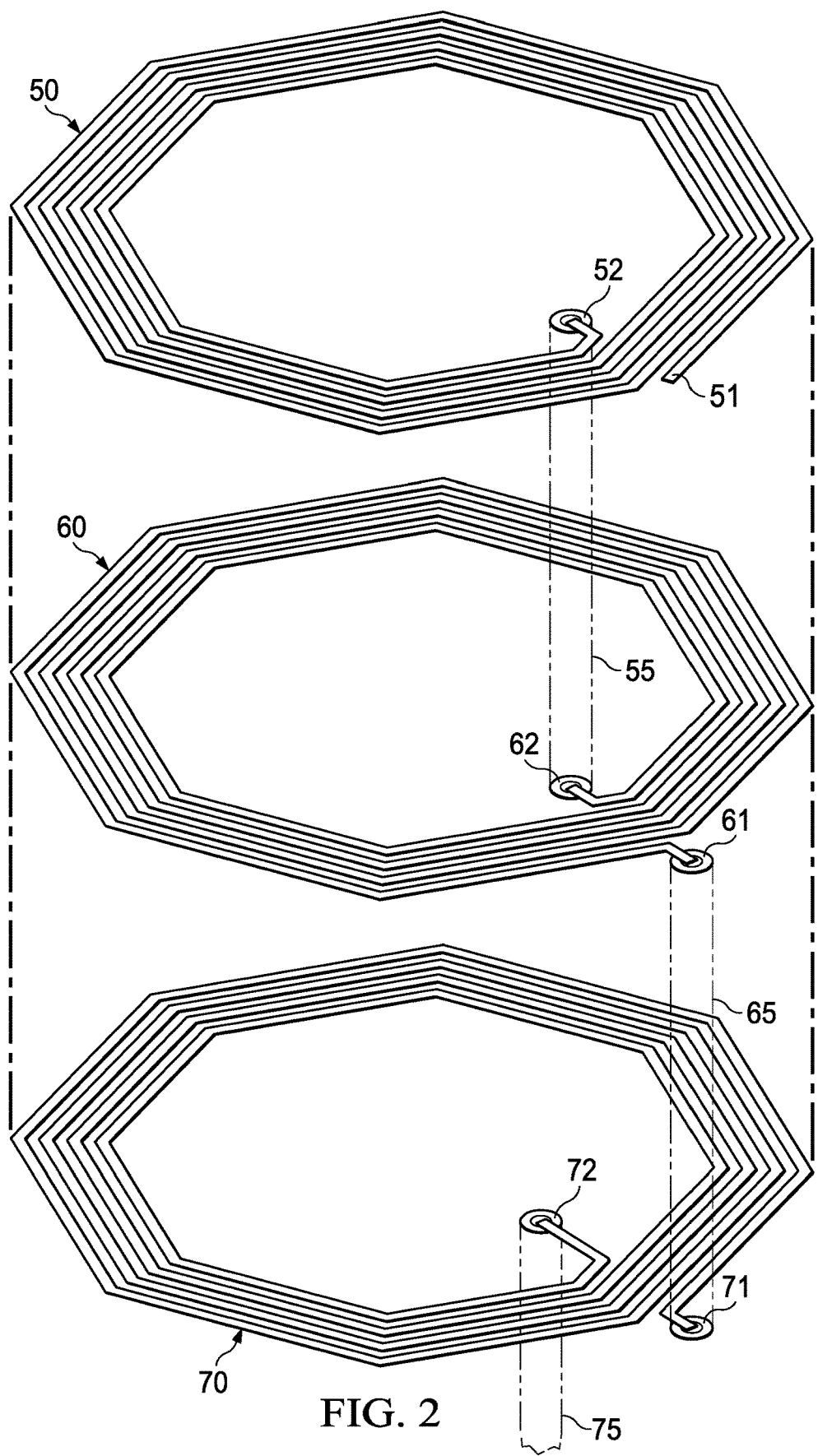
FIG. 2 illustrates a three-coil inductor with one of the inductors terminals being landlocked within the interior area defined by one of the three coils.

The inductance of the two-coil inductor represented in FIG. 1 is a function at least of the number of turns of each coil 50 and 60 and the mutual inductance between the two coils. If a larger inductance value is needed, a third conductive coil could be added to form, as is shown in FIG. 2, a three-coil inductor. Coil 70 is shown along with coils 50 and 60. Coil 70 includes an outer terminal 71 and an inner terminal 72. A second via 65 electrically connects outer terminals 61 and 71 of coils 60 and 70, respectively. From terminal 71 of coil 70, coil 70 wraps counterclockwise towards the inner terminal 72, which would represent the end terminal of the inductor (in addition to outer terminal 51). Unfortunately, the end terminal of the inductor being coil 70's inner terminal 72 is "landlocked" meaning there is no route a conductive trace on the metal layer comprising coil 70 to inner terminal 72 without shorting to the windings of coil 70 itself. Instead, another via 75 is needed to connect inner terminal 72 to yet another metal layer—a metal layer that would not include a coil of the inductor and whose only purpose might be to provide electrical connectivity to terminal 72 of coil 70. In this latter case, although three coils 50, 60, and 70 are shown, four metal layers would be needed—one for each of the three coils and one for electrical connectivity to terminal 72 of coil 70. To avoid an extra metal layer which does not add to the inductance and merely provides electrical connectivity to one of the inductor's coils, multi-coil inductors preferably comprise an even number of coils as was the case for FIG. 1 in which neither of the two end terminals 51, 61 of the inductor are landlocked.

Figure 3:
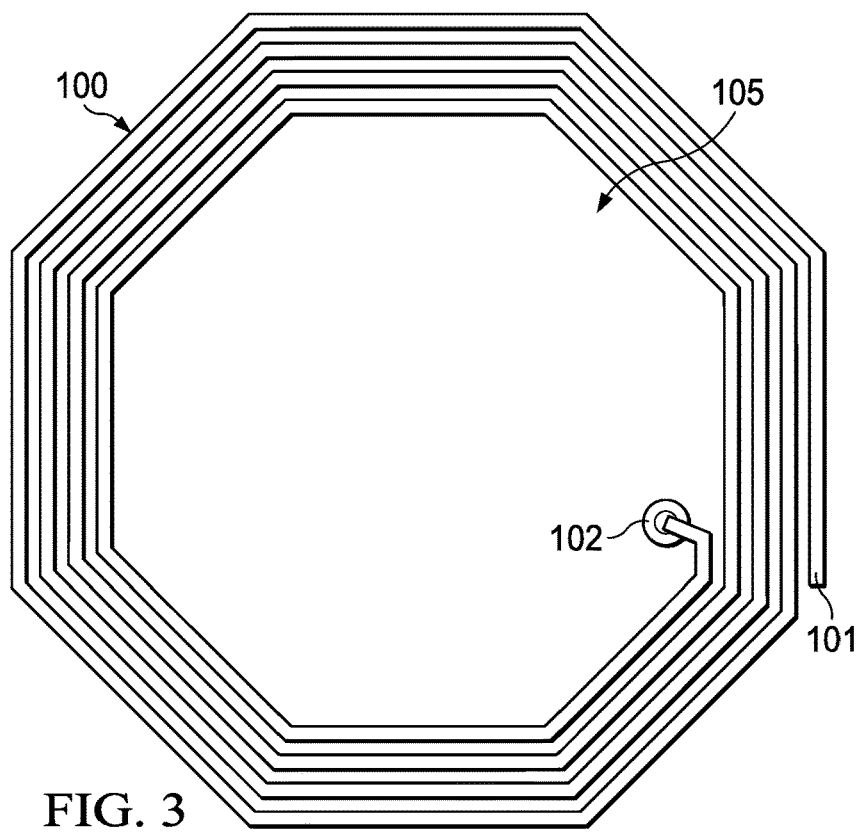
FIG. 3 illustrates a first conductive coil comprising a portion of an inductor.
Figure 4:
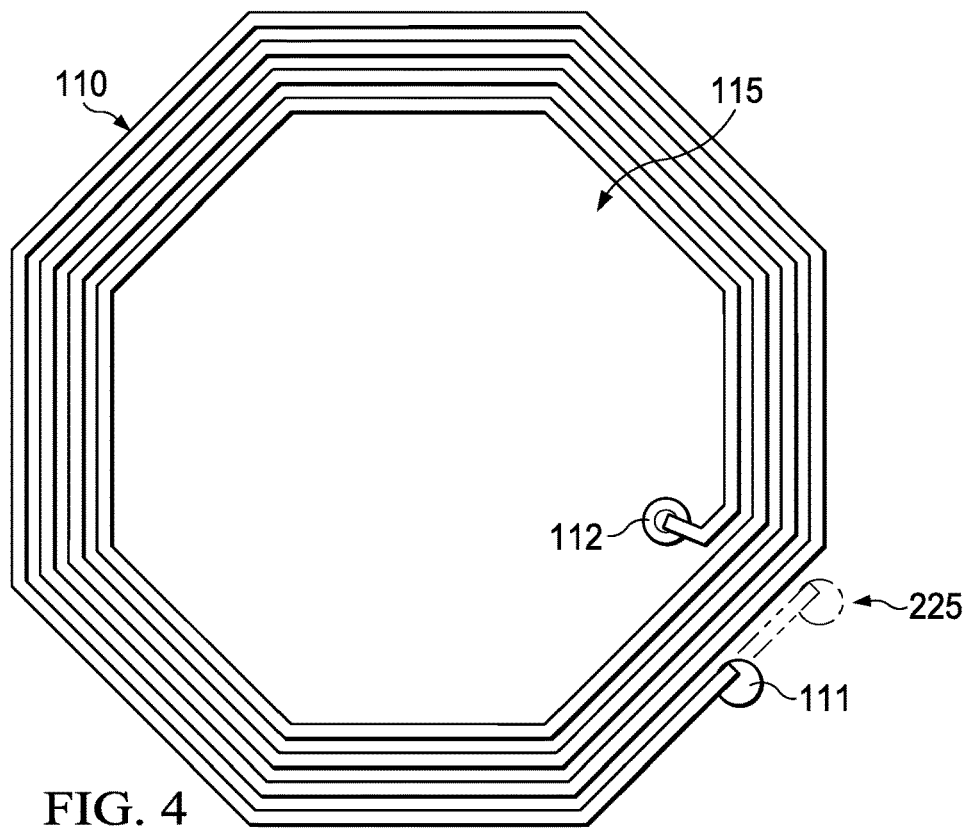
FIG. 4 illustrates a second conductive coil of the inductor of FIG. 3.
Figure 5:
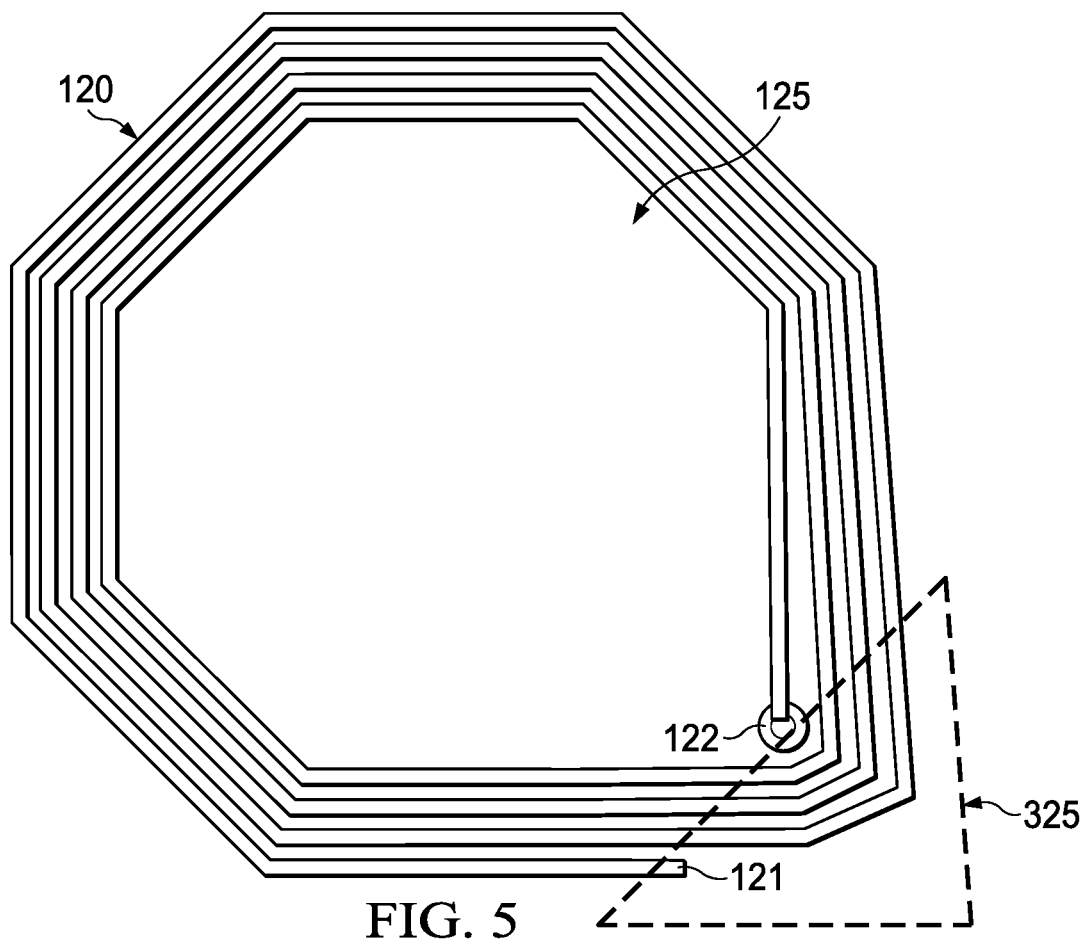
FIG. 5 illustrates a third conductive coil of the inductor of FIG. 3.

FIGS. 3-5 illustrate another example of an inductor having three coils 100, 110, and 120. FIGS. 3-5 illustrate the three coils 110, 110, and 120 as top-down views. Coil 100 is implemented using a first metal layer (which may be used with other device structures) with the structure comprising the inductor. Coil 110 is implemented on a second metal layer (which may be used with other device structures) and coil 120 is implemented on a third metal layer (which may be used with other device structures). Each coil 100, 110, and 120 is constructed of an electrically conductive material (e.g., aluminum, titanium, tantalum, tungsten, copper, and/or mixtures of or layers of these metals) and comprises at least one loop (also called a winding). The coils 100, 110, and 120 are illustrated as a series of connected straight lines. In one example, however, the corners between the segments are curved. Each coil has terminals at either end. Coil 100 includes terminals 101 and 102. Coil 110 includes terminals 111 and 112. Coil 120 includes terminals 121 and 122. Terminals 101, 111, and 121 are provided outside their respective coils 100, 110, and 120. Terminals 102, 112, and 122 are provided inside their respective coils, that is, within the interior areas 105, 115, and 125 defined by the coils 100, 110, and 120, respectively.

Figure 6:
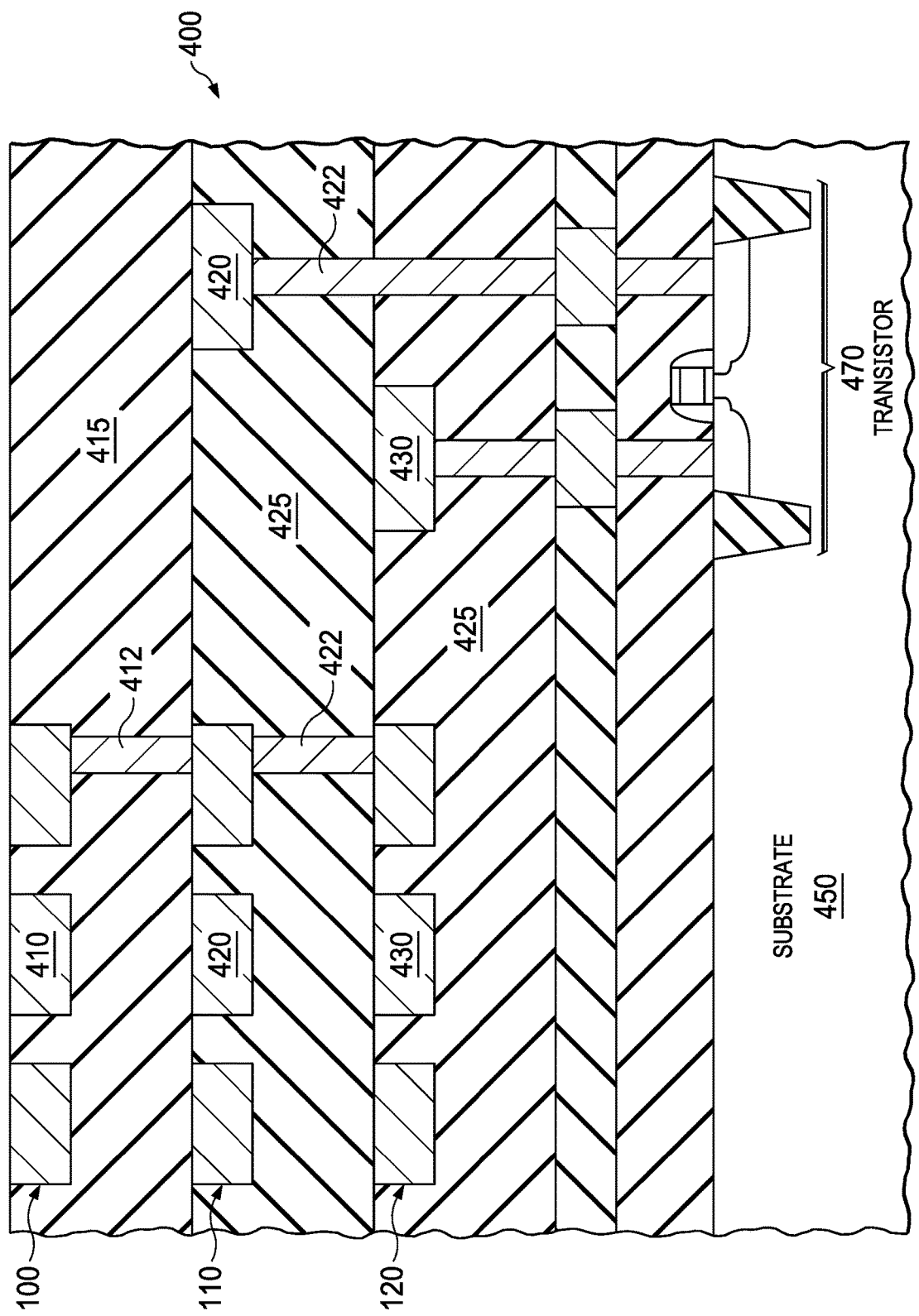
FIG. 6 illustrates the odd number of metal layers that comprise the coils of the inductor of FIG. 3.

FIG. 6 illustrates the relative position of the coils within a semiconductor device 400. While the implementation is shown in relationship to a semiconductor device, the implementation of the coil of the example embodiments, alternatively may be in a PCB, a semiconductor package, or other type of structure comprising the inductor. In this example, the inductor of an example embodiment is formed laterally spaced from and above a transistor 470. In alternative embodiments, other semiconductor devices (e.g., transistors, diodes, capacitors, resistors, etc.) are formed within and over semiconductor substrate 450. In addition, the example inductor may be formed directly over these device structures and will, preferably, be electrically connected to one or more device structures. The device 400 includes metal layers 410, 420, and 430. Preferably, these metal layers will be used to interconnect the other device structures formed in and above the semiconductor substrate 450. A non-conductive layer 415 separates metal layers 410 and 420; a non-conductive layer 425 separates metal layers 420 and 430 and non-conductive layer 435 separates metal layer 430 from underlying structures. Each non-nonconductive layer may comprise one or more layers of dielectric material (e.g., Bismaleimide-Triazine resin (BT), silicon dioxide, silicon nitride, doped silicon oxide, etc.) silicon nitride, doped silicon oxide, etc.) and each layer is preferably formed over the entire device 400. However, in other example embodiments, the portions of the non-conductive layers situated around coils 100, 110 and 120 may be comprised of dielectric material(s) (that have different electrical properties) than the dielectric materials used over the other device structures. In other example embodiments, the coil may include additional metal/non-conductive layers. Additionally, the coil may be formed in each metal layer of device 400 or device 400 may utilize more metal/non-conductive layers than are used to form the inductor coils.

Coil 100 is implemented in metal layer 410. Coil 110 is implemented in metal layer 420 and coil 120 is implemented in metal layer 430. Coil 100 is connected to coil 110 via a conductive via 412 and coil 110 is connected to coil 120 via a conductive via 422. Terminals 101 and 121 (not shown in FIG. 6) represent the end terminals of the two-terminal inductor comprising the three coils 100, 110, and 120. End terminals 101 and 121 are accessible within the metal layers comprising their respective coils. Conductive traces can be routed to terminals 101 and 121 to thereby electrically connect each of the end terminals 101 and 121 of the inductor to other electrical components formed within the device 400 (or, in the case of a semiconductor die, routed to an external pin of the package comprising the die). Via 412 is formed from coil 100 to coil 110 through non-conductive layer 415. Via 422 is formed from coil 110 to coil 120 through non-conductive layer 425.

Figure 7:
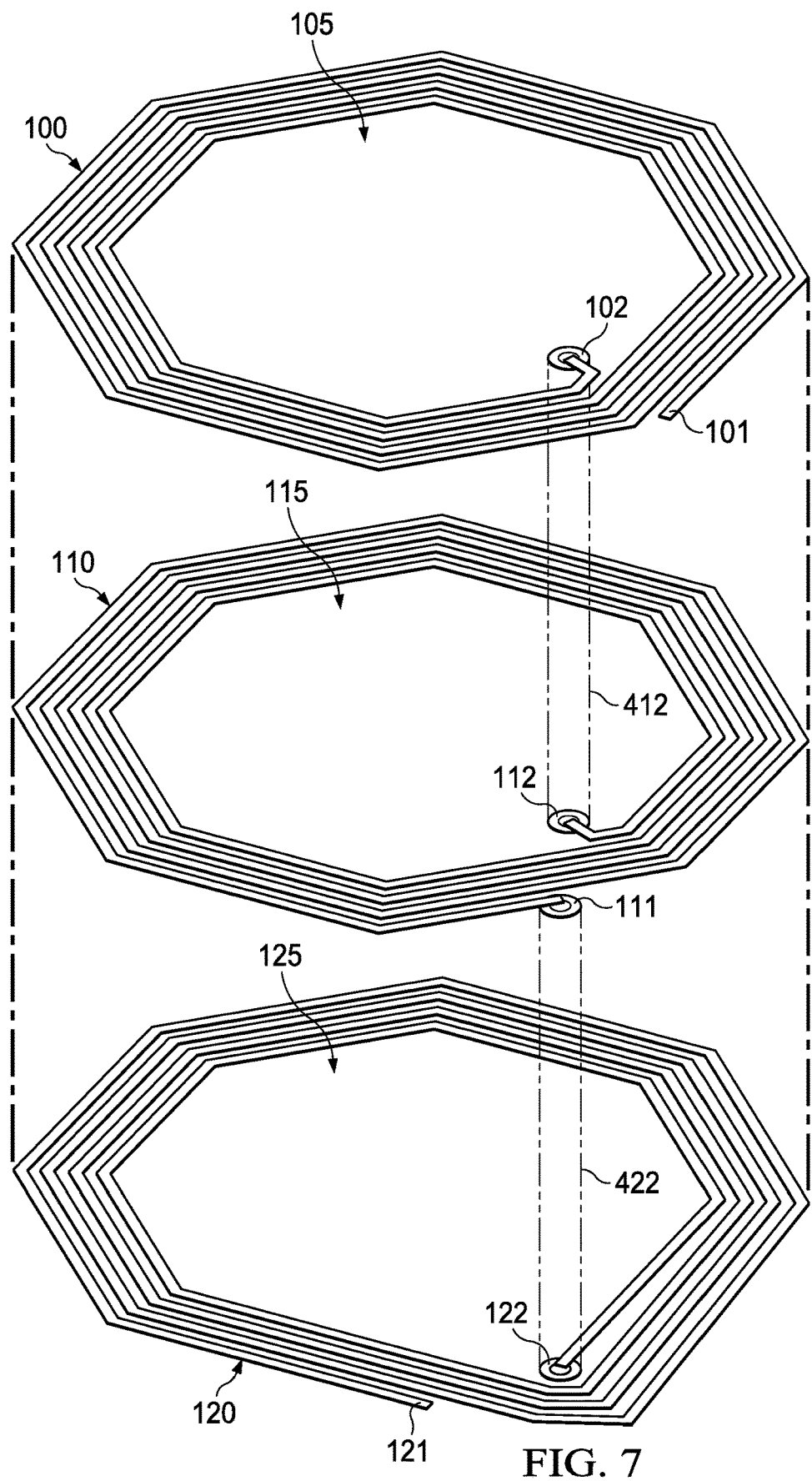
FIG. 7 illustrates a three-dimensional view showing vias interconnecting the coils of the inductor of FIG. 3.

FIG. 7 shows a three-dimensional, perspective view of the three-coil inductor. Via 412 is shown interconnecting terminal 102 of coil 100 to terminal 112 of coil 110. Via 422 is shown interconnecting terminal 111 of coil 110 to terminal 122 of coil 120.

As noted above, terminal 101 of coil 100 is outside coil 100. Starting from terminal 101 of coil 100, the coil wraps counterclockwise inward to opposing terminal 102. Terminal 102 is thus in the interior area 105 defined by coil 100. Via 412 connects terminal 102 of coil 100 (of metal layer 410) to corresponding terminal 112 of coil 110 of metal layer 420. Terminal 112 is within the interior area 115 defined by coil 110. Starting with terminal 112, coil 110 wraps counterclockwise outward to opposing terminal 111, which is outside coil 110. Via 422 connects terminal 111 of coil 110 (of metal layer 420) to corresponding terminal 122 of coil 120 in metal layer 430. Terminal 122 is within the interior area 125 defined by coil 120. Starting with terminal 122, coil 120 wraps counterclockwise outward to opposing terminal 121, which is outside coil 120.

As best seen in the examples of FIGS. 3-5 (but also in FIGS. 7 and 8), coil 110 terminates at terminal 111 outside coil 110 but at a location that, with respect to coil 120, is inside area 125 defined by coil 120. As such, coil 120, starting at terminal 122 (which, in this example, is generally vertically aligned with terminal 111 of coil 110 so that the terminals 111 and 122 can be connected by via 422) is mostly within the footprint of coils 110 and 110. As illustrated at 325 in FIGS. 5 and 8, some of coil 120 is outside the footprint of the other two coils 100 and 110. If terminal 111 of coil 110 was terminated at, for example, location 225 (FIG. 4), then a larger percentage of coil 120 would be outside the footprint defined by coil 100 and 110, which would in turn occupy more area than the example shown in FIGS. 3-5 and 7.

Figure 8:
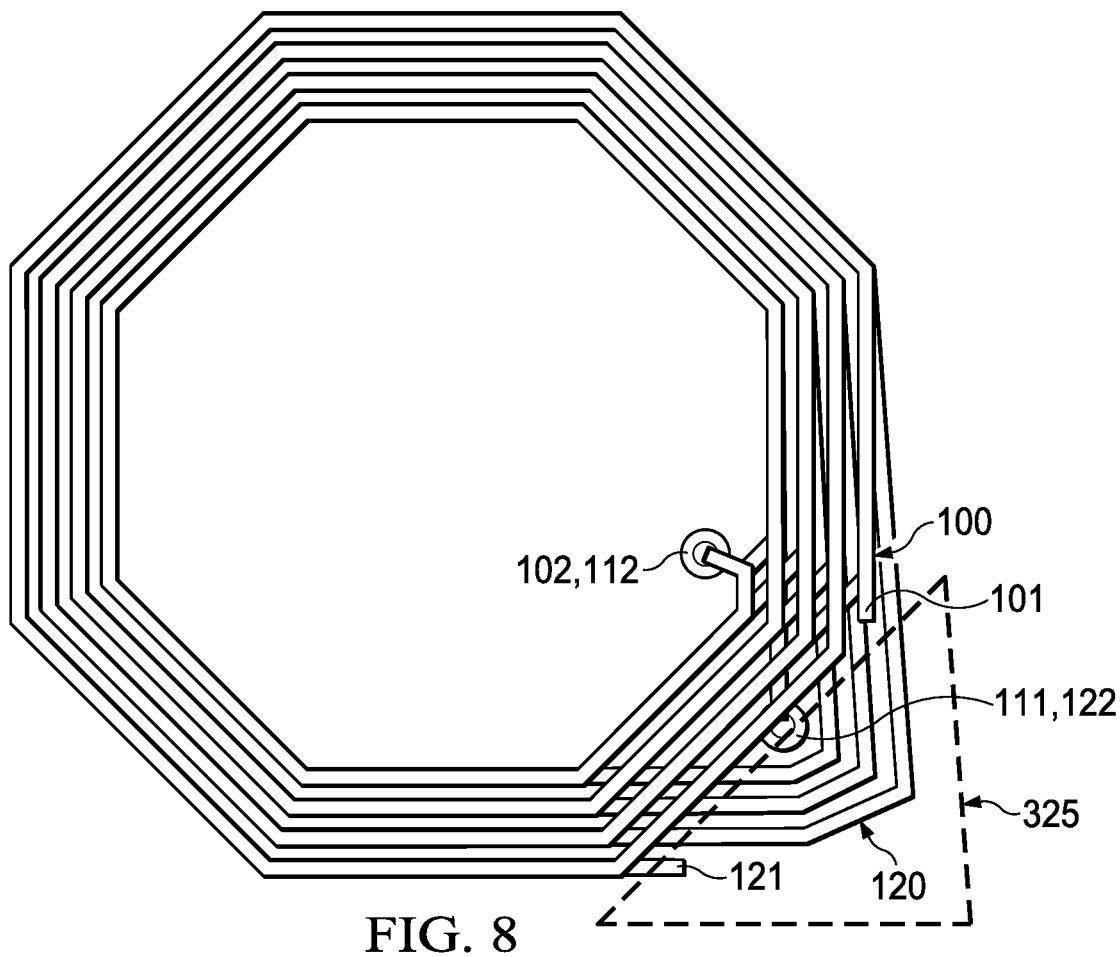
FIG. 8 shows a top-down view of all of the coils of the inductor of FIG. 3.

FIG. 8 shows a top-down view of all three coils 100, 110, and 120. Terminal 102 of coil 100 is vertically spaced from terminal 112 of coil 110 and thus terminals 102 and 112 are shown at the same location in the top-down view of FIG. 6. Similarly, terminal 112 of coil 110 is vertically spaced from terminal 122 of coil 120 and thus terminals 112 and 122 are also shown at the same location in FIG. 8. FIG. 8 also illustrates that the footprints of coils 100 and 110 generally coincide with each other, while coil 120 includes portion 325 that extends outside the footprint of the other two coils.

Figure 9:
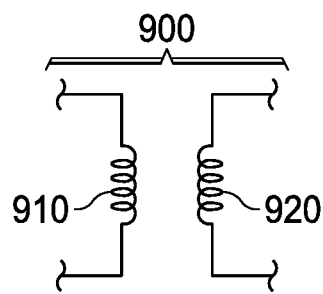
FIG. 9 shows an example of transformer in which at least one of the primary or secondary is implemented using an inductor such as that shown in the example of FIG. 7.

FIG. 9 shows an example of transformer 900 comprising a primary 910 and a secondary 920. In one example implementation, the transformer 900 comprises an air core transformer. Either or both the primary 910 and secondary 920 may be implemented as any of the inductors described herein. For example, one of the primary 910 and secondary 920 may be implemented as the two-metal layer inductor of FIG. 1 and the other of the primary 910 and secondary 920 may be implemented as the three-metal layer inductor of FIGS. 6 and 7.

The inductor shown in FIGS. 3-8 and described herein is implemented as an odd number of conductive coils on a corresponding odd number of metal layers with each of the two end terminals of the inductor provided on one of the aforementioned odd number of metal layers. That is, one end terminal of the inductor is provided on the same metal layer as one of the inductor's coils and the other end terminal of the inductor is provided on another metal layer also including another of the inductor's coils. Such an inductor comprises an odd number of coils, each provided on a separate metal layer. Because both end terminals of the inductor are provided outside their respective coils, the end terminals are not "landlocked" and thus an extra metal layer is not needed as was the case for the example of FIG. 2. With three, interconnected conductive coils, the inductor of FIGS. 3-8 has a higher inductance than the two-coil implementation of FIG. 1, while not requiring an extra (fourth) metal layer as was the case for the three-coil inductor of FIG. 2.

Modifications are possible in the described embodiments, and other embodiments are possible, within the scope of the claims.

What is claimed is:

1. A device, comprising:
   a first metal layer including a first conductive coil defining an inner area, the first conductive coil having a first terminal outside the first conductive coil and a second terminal within the inner area, the first terminal of the first conductive coil for external coupling;
   a second metal layer having a second conductive coil defining an inner area, the inner area defined by the second conductive coil, which at least partially overlaps the inner area defined by the first conductive coil, the second conductive coil having a first terminal outside the second conductive coil and a second terminal within the inner area defined by the second conductive coil, the first conductive coil at least partially overlapping the second conductive coil;
   a first via electrically coupling together the second terminals of the first and second conductive coils;
   a third metal layer having a third conductive coil defining an inner area, the inner area defined by the third conductive coil, which at least partially overlaps the inner areas of the first and second conductive coils, the third conductive coil having a first terminal outside the third conductive coil and a second terminal within the inner area defined by the third conductive coil, the second conductive coil at least partially overlapping the third conductive coil, the first terminal of the third conductive coil for external coupling; and
   a second via directly coupling together the first terminal of the second conductive coil and the second terminal of the third conductive coil, wherein:
   the first conductive coil is wound counterclockwise from the first terminal of the first conductive coil to the second terminal of the first conductive coil;
   the second conductive coil is wound counterclockwise from the second terminal of the second conductive coil to the first terminal of the second conductive coil; and
   the third conductive coil is wound counterclockwise from the second terminal of the third conductive coil to the first terminal of the third conductive coil.

2. An electronic device formed on a semiconductor substrate, the electronic device comprising:
   a transistor; and
   an inductor coupled to the transistor, the inductor comprising:
      a first metal layer including a first conductive coil defining an inner area, the first conductive coil having a first terminal outside the first conductive coil and a second terminal within the inner area, the first terminal of the first conductive coil for external coupling;
      a second metal layer having a second conductive coil defining an inner area, the inner area defined by the second conductive coil, which at least partially overlaps the inner area defined by the first conductive coil, the second conductive coil having a first terminal outside the second conductive coil and a second terminal within the inner area defined by the second conductive coil, the first conductive coil at least partially overlapping the second conductive coil;
      a first via electrically coupling together the second terminals of the first and second conductive coils;
      a third metal layer having a third conductive coil defining an inner area, the inner area defined by the third conductive coil, which at least partially overlaps the inner areas of the first and second conductive coil, the third conductive coil having a first terminal outside the third conductive coil and a second terminal within the inner area defined by the third conductive coil, the second conductive coil at least partially overlapping the third conductive coil, the first terminal of the third conductive coil for external coupling; and
      a second via directly coupling together the first terminal of the second conductive coil and the second terminal of the third conductive coil, wherein:
   the first conductive coil is wound counterclockwise from the first terminal of the first conductive coil to the second terminal of the first conductive coil;
   the second conductive coil is wound counterclockwise from the second terminal of the second conductive coil to the first terminal of the second conductive coil; and
   the third conductive coil is wound counterclockwise from the second terminal of the third conductive coil to the first terminal of the third conductive coil.

* * * * *